(12) United States Patent
Futatsuya et al.

(10) Patent No.: US 6,862,726 B2
(45) Date of Patent: Mar. 1, 2005

(54) LIGHT INTENSITY SIMULATION METHOD, PROGRAM PRODUCT, AND DESIGNING METHOD OF PHOTOMASK

(75) Inventors: Hiroki Futatsuya, Kawasaki (JP); Morimi Osawa, Kawasaki (JP)

(73) Assignee: Fujitsu Limted, Kawasaki (JP)

( * ) Notice: Subject to any disclaimer, the term of this patent is extended or adjusted under 35 U.S.C. 154(b) by 85 days.

(21) Appl. No.: 10/353,938

(22) Filed: Jan. 30, 2003

(65) Prior Publication Data

US 2004/0025138 A1 Feb. 5, 2004

(30) Foreign Application Priority Data

Jul. 31, 2002 (JP) ........................................ 2002-224038

(51) Int. Cl.[7] ............................................. G06F 17/50
(52) U.S. Cl. ............................. 716/19; 716/20; 716/21
(58) Field of Search ..................... 716/19–21; 356/121, 356/124, 521; 702/22; 703/13

(56) References Cited

U.S. PATENT DOCUMENTS

| | | | | |
|---|---|---|---|---|
| 5,680,588 A | * | 10/1997 | Gortych et al. ............... | 716/19 |
| 5,745,370 A | * | 4/1998 | Ohtsu et al. .................... | 716/3 |
| 6,049,660 A | * | 4/2000 | Ahn et al. ..................... | 703/13 |
| 6,487,503 B2 | * | 11/2002 | Inui ............................. | 702/22 |
| 6,526,564 B1 | * | 2/2003 | Gilson .......................... | 716/21 |
| 6,606,739 B2 | * | 8/2003 | Kanatake et al. ............. | 716/21 |
| 6,745,372 B2 | * | 6/2004 | Cote et al. ..................... | 716/2 |

* cited by examiner

Primary Examiner—Vuthe Siek
Assistant Examiner—Naum Levin
(74) Attorney, Agent, or Firm—Westerman, Hattori, Daniels & Adrian, LLP

(57) ABSTRACT

Light intensities at light intensity calculation points on the photomask are found approximately based on distances from barycenters of opening patterns, and areas and transmission factors of the opening patterns. Thereafter, the result is added to a distribution of light intensity which is obtained by the conventional simulation without consideration given to the influence of the local flare. According to such a method, it is possible to easily carry out the simulation of the light intensity with high accuracy.

20 Claims, 12 Drawing Sheets

LIGHT INTENSITY SIMULATION METHOD, PROGRAM PRODUCT, AND DESIGNING METHOD OF PHOTOMASK

CROSS-REFERENCE TO RELATED APPLICATIONS

This application is based upon and claims the benefit of priority from the prior Japanese Patent Application No. 2002-224038, filed on Jul. 31, 2002, the entire contents of which are incorporated herein by reference.

BACKGROUND OF THE INVENTION

1. Field of the Invention

The present invention relates to a light intensity simulation method, a light intensity simulation program product, a recording medium and a designing method of a photomask which is used in photolithography in manufacturing a semiconductor device and the like.

2. Description of the Related Art

In manufacturing the semiconductor device and the like, various patterns formed in the photomask are transferred to a photosensitive resist formed on a substrate by photolithography. After this transfer, the photosensitive resist is developed, and processing of a wiring layer or the like is carried out using the patterns of the photosensitive resist as masks. In such photolithography, a projection exposure device of refraction optical system or reflection/refraction optical system is used.

Moreover, a method of carrying out light intensity simulation of such lithography has been adopted in order to understand the optical property of the transfer in advance. FIG. 17 is a schematic view showing a part of one example of the patterns of the photomask, and FIG. 18 is a schematic view showing the conventional light intensity simulation method with respect to the photomask shown in FIG. 17.

According to the conventional light intensity simulation method, when an exposure wavelength is 0.193 μm and four opening patterns 1 to 4 exist in a part of the photomask, as shown in FIG. 17, a rectangular area whose side length is about 2 to 10 μm is made to be a unit of calculation, as shown in FIG. 18. FIG. 19 is a graph showing the light intensity along the I—I line in FIG. 17, which is obtained by the conventional simulation method.

In recent years, a phenomenon called local flare is becoming a problem as the exposure wavelength becomes shorter. This local flare is caused due to an aberration of an exposure machine. However, a light intensity simulation method taking the influence by the local flare into consideration has not been established conventionally. For this reason, there is a problem that the light intensity simulation with high accuracy cannot be carried out. Accordingly, it becomes difficult to design the photomask for transferring desired patterns onto a photosensitive material such as the photosensitive resist.

In forming the various patterns in a microchip, the projection exposure device of refraction optical system or reflection/refraction optical system is used as described above. However, light whose optical path is different from the designed one is generated due to reflection and scattering of the surface and the inside of a lens of illumination optical system, mask, projection lens and the like, nonuniformity of a refractive index of lens material, and the like. Namely, stray light is uniformly caused over a whole area of one shot of about 20 mm². This is a phenomenon called flare.

Moreover, in recent years, there are increasing demands for fining and high integration of the semiconductor device, and accordingly, light for exposure which is adopted in the projection exposure device is becoming shorter. In concrete, the light for exposure whose wavelength is 193 nm is adopted. Due to a peculiarity of lens material corresponding to such a short wavelength, it is becoming a problem that fog of light differs according to an opening area near a pattern, and local flare is generated depending on an exposure pattern. Such flare is referred to as the local flare, which mainly causes unexpected changes in a shape and a line width of the pattern to be transferred.

SUMMARY OF THE INVENTION

The present invention has been made in view of the above problems, and its object is to provide a light intensity simulation method, a light intensity simulation program product, a recording medium and a designing method of a photomask, which can secure high accuracy while taking local flare into consideration.

As a result of assiduous studies, the inventor of the present invention has come up with various forms of the inventions described below.

A light intensity simulation method according to the present invention is for calculating intensity of light transmitting a photomask by simulation. According to a first light intensity simulation method of the present invention, light intensity is calculated at respective light intensity calculation points on the photomask, while considering influence of local flare, which is caused by an aberration on the pupil plane of a projection lens, as one of factors.

According to a second light intensity simulation method of the present invention, light intensity at respective light intensity calculation points on the photomask is first calculated, without considering influence of local flare, which is caused by an aberration on the pupil plane of a projection lens, as a factor. Next, positions of barycenters, areas, and transmission factors of respective patterns existing on the photomask are found. Next, light intensity only by the influence of local flare at the respective light intensity calculation points on the photomask is calculated based on distances between the respective light intensity calculation points and the respective barycenters, and the areas and the transmission factors of the respective patterns. Then, the light intensity without considering the influence of local flare as the factor and the light intensity only by the influence of local flare are added.

According to a third light intensity simulation method of the present invention, light intensity at respective light intensity calculation points on the photomask is first calculated, without considering influence of local flare, which is caused by an aberration on the pupil plane of a projection lens, as a factor. Next, measuring regions with the respective light intensity calculation points on the photomask as centers thereof are defined. Next, occupying factors of respective patterns existing on the photomask occupying the measuring regions are found with respect to the respective light intensity calculation points. Thereafter, light intensity only by the influence of local flare at the respective light intensity calculation points is calculated based on the pattern occupying factor. Then, the light intensity without considering the influence of local flare as the factor and the light intensity only by the influence of local flare are added.

According to the present invention, it is possible to carry out the simulation while considering the influence of the local flare appropriately. Therefore, high accuracy can be secured. Further, when the photomask is corrected based on the result of such simulation, it is possible to design a desired photomask.

DETAILED DESCRIPTION OF THE PREFERRED EMBODIMENTS

Hereinafter, a light intensity simulation method, a light intensity simulation program, a recording medium and a designing method of a photomask according to embodiments of the present invention will be explained with reference to the attached drawings.

First Embodiment

Figure 1:
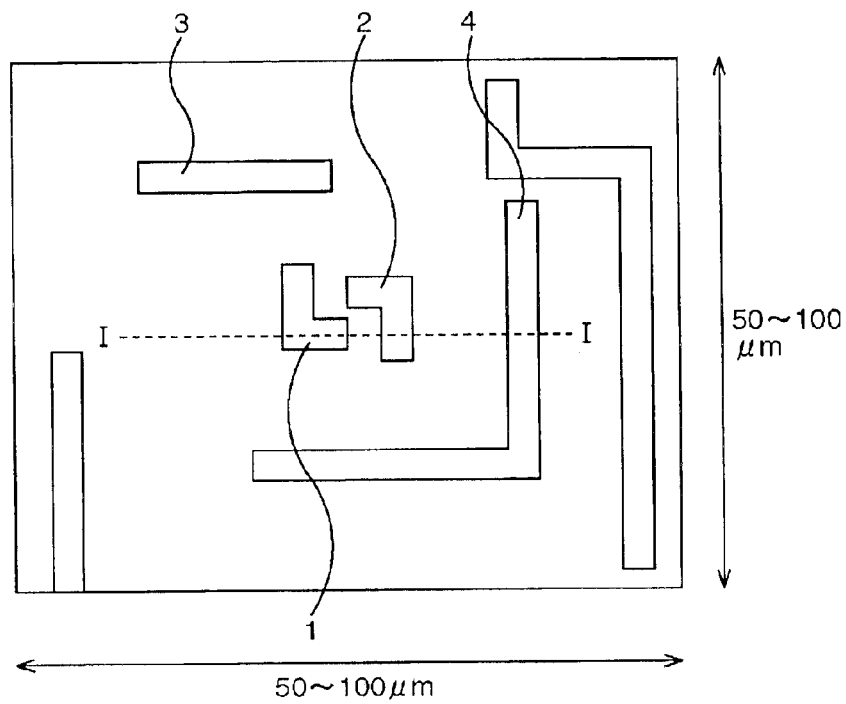
FIG. 1 is a schematic view showing a light intensity simulation method according to a first embodiment of the present invention with respect to a photomask shown in FIG. 17.

First, a light intensity simulation method according to a first embodiment of the present invention will be explained. FIG. 1 is a schematic view showing the light intensity simulation method according to the first embodiment of the present invention with respect to a photomask shown in FIG. 17.

According to this embodiment, when an exposure wavelength is 0.193 $\mu$m, a rectangular area whose side length is about 50 to 100 $\mu$m is made to be a unit of calculation in order to take influence of local flare into consideration, as shown in FIG. 1. This is because the influence of the local flare by a pattern in a mask is within the limit of about 50 $\mu$m from the pattern. As described above, according to the conventional method, the rectangular area whose side length is about 2 to 10 $\mu$m is made to be the unit of calculation, and hence it is impossible to take the influence of the local flare into account sufficiently.

Figure 2:
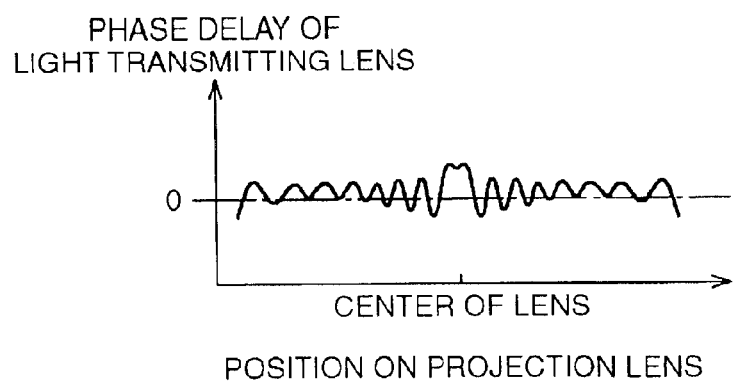
FIG. 2 is a graph showing an example of an aberration on the pupil plane of a projection lens.

According to this embodiment, an aberration of a projection lens is approximated by a function of fiftieth to sixtieth degree. FIG. 2 is a graph showing an example of the aberration on the pupil plane of the projection lens. Although the aberration is approximated in the conventional method as well, its degree of the function is secondary or tertiary.

Figure 3:
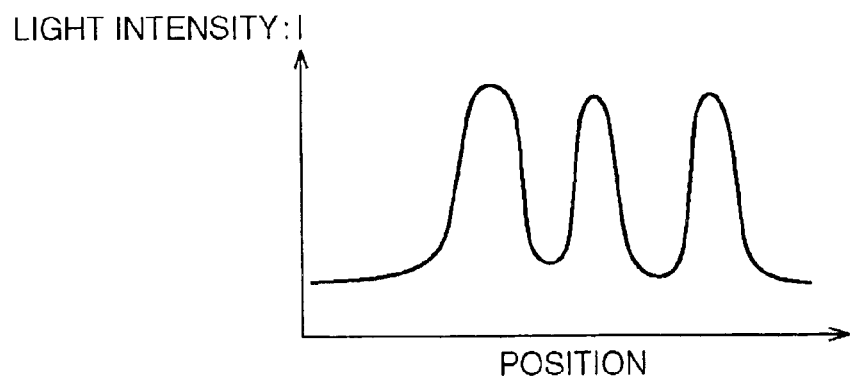
FIG. 3 is a graph showing light intensity along the I—I line in FIG. 17, which is obtained by the light intensity simulation method according to the first embodiment of the present invention.
Figure 17:
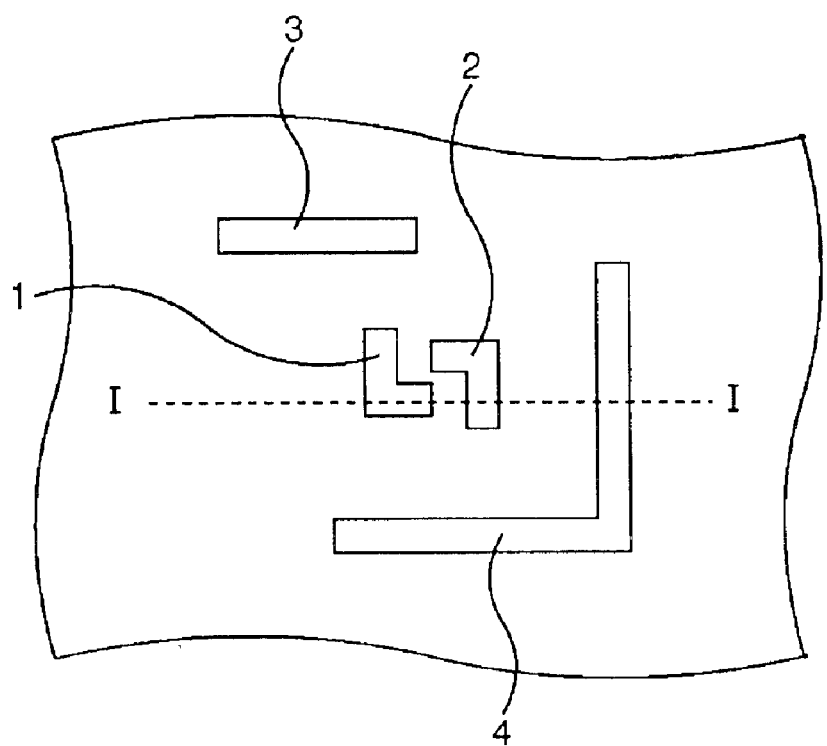
FIG. 17 is a schematic view showing a part of one example of the patterns of the photomask.
Figure 18:
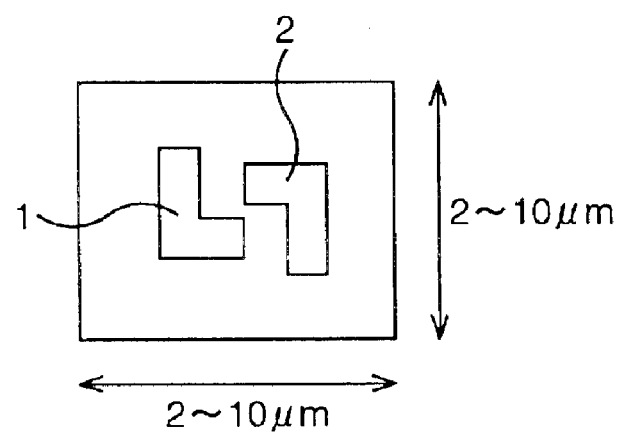
FIG. 18 is a schematic view showing a conventional light intensity simulation method with respect to the photomask shown in FIG. 17.
Figure 19:
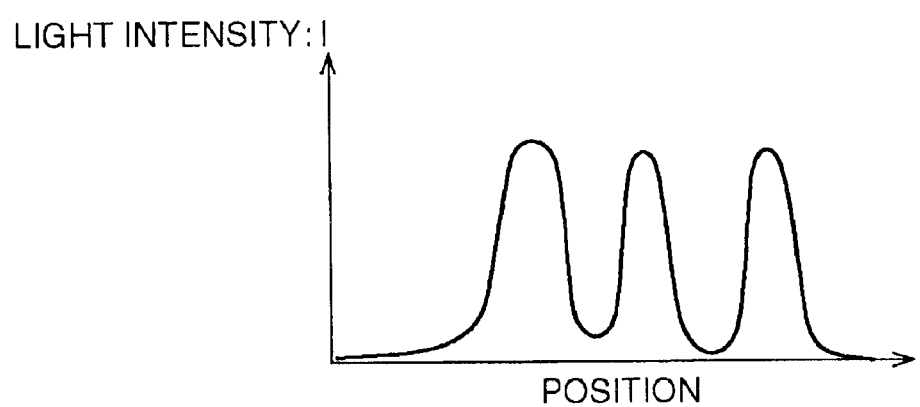
FIG. 19 is a graph showing light intensity along the I—I line in FIG. 17, which is obtained by the conventional simulation method.

FIG. 3 is a graph showing the light intensity along the I—I line in FIG. 17, which is obtained by the light intensity simulation method according to the first embodiment. When comparison is made with FIG. 19, the light intensity is increased as a whole. This increased amount is due to the influence of the local flare.

According to the first embodiment as described above, it is possible to secure higher accuracy.

Second Embodiment

Figure 4:
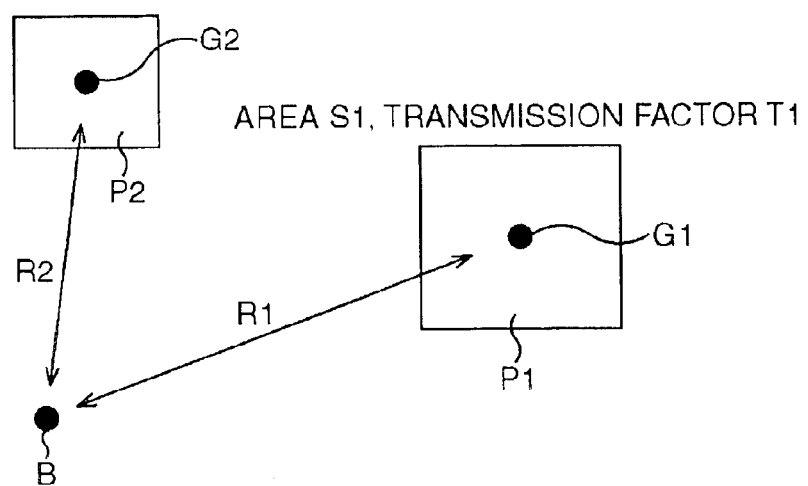
FIG. 4 is a schematic view showing a principle of a light intensity simulation method according to a second embodiment of the present invention.

Next, a light intensity simulation method according to a second embodiment of the present invention will be explained. According to the second embodiment, the influence of the local flare is estimated based on a shape of a photomask, not on the aberration of the lens. FIG. 4 is a schematic view showing a principle of the light intensity simulation method according to the second embodiment of the present invention.

In a photomask shown in FIG. 4, it is supposed that only opening patterns P1 and P2 are formed. Further, it is supposed that an area and a transmission factor of the opening pattern P1 are S1 and T1, respectively, and an area and a transmission factor of the opening pattern P2 are S2 and T2, respectively. According to this embodiment, as shown in FIG. 4, the light intensity at a light intensity calculation point B on the photomask is found approximately based on a distance R1 from a barycenter G1 of the opening pattern P1, a distance R2 from a barycenter G2 of the opening pattern P2, the areas S1 and S2, and the transmission factors T1 and T2. At this time, light intensity F2 due to the influence of the local flare is expressed by, for example, the following expression 1.

$$F2 = \alpha + \beta \times \Sigma f1\ (Rn,\ Sn,\ Tn)(n=1,\ 2) \qquad \text{Expression 1}$$

The coefficients $\alpha$ and $\beta$ in the expression 1 are fitting coefficients. Additionally, the function f1 (Rn, Sn, Tn) is, for example, an error function (influence: Gaussian distribution).

Then, the light intensity F2 due to the influence of the local flare is found at each light intensity calculation point on the photomask. Thereafter, the result is added to a distribution of light intensity I which is obtained by the conventional simulation without consideration given to the influence of the local flare. It should be noted that either of the distribution of the light intensity F2 due to the influence of the local flare and the distribution of the light intensity I obtained by the simulation without consideration given to the influence of the local flare may be found first.

According to the above-described second embodiment, it is possible to easily carry out the simulation of the light intensity with high accuracy.

Next, the result of the actual light intensity simulation by the method according to the second embodiment will be explained. Here, the light intensity simulation is carried out in exposure using a photomask shown in FIG. 5. Incidentally, in FIG. 5, a covered region shows a light-shielding region, and the other regions show transmission regions.

Figure 5:
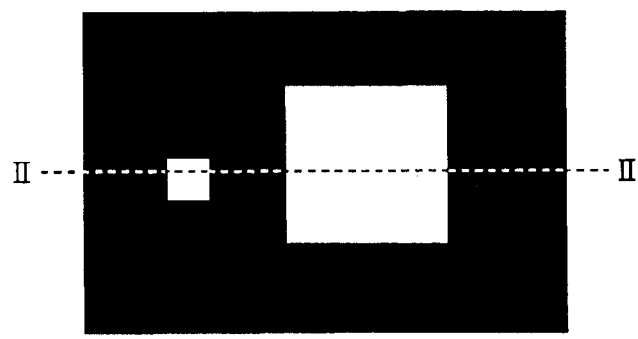
FIG. 5 is a schematic view showing a photomask to be an object of the light intensity simulation method according to the second embodiment of the present invention.
Figure 6A:
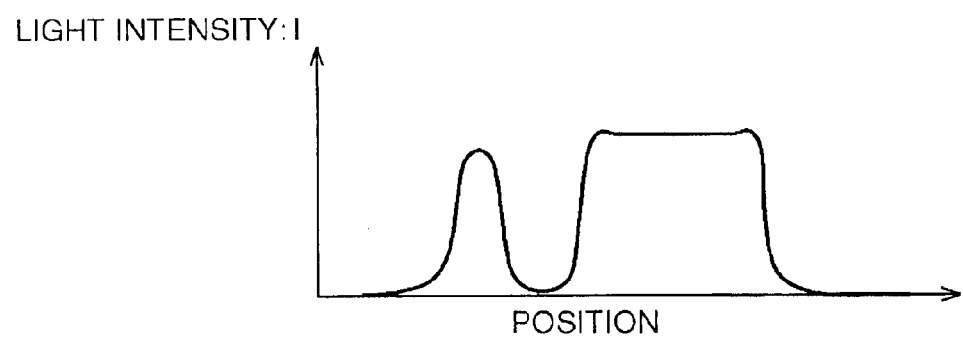
FIG. 6A and FIG. 6B are graphs showing the distribution of light intensity I and the distribution of light intensity F2 along the II—II line in FIG. 5, respectively.

According to this light intensity simulation, the simulation of the light intensity I is first carried out without consideration given to the local flare, according to the conventional method. The distribution of the light intensity I along the II—II line in FIG. 5 is shown in FIG. 6A.

Figure 6B:
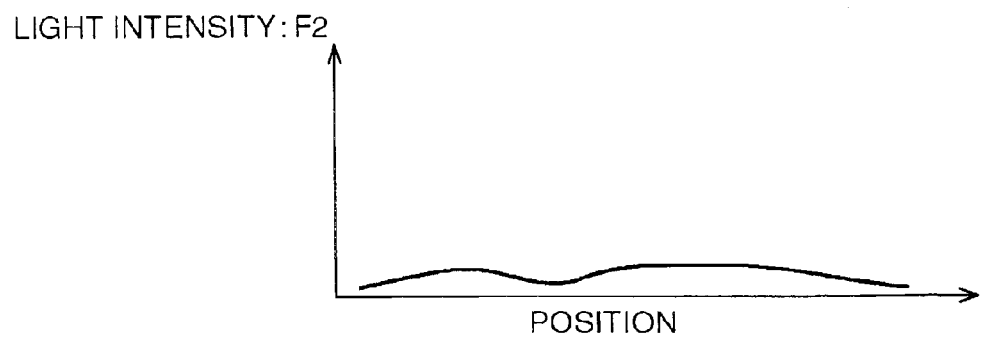

Next, the distribution of the light intensity F2 is found from the expression 1 based on the distances between a measured point of the light intensity and the respective opening patterns, the areas and the transmission factors of the respective opening patterns. The distribution of the light intensity F2 along the II—II line in FIG. 5 is shown in FIG. 6B.

Figure 7:
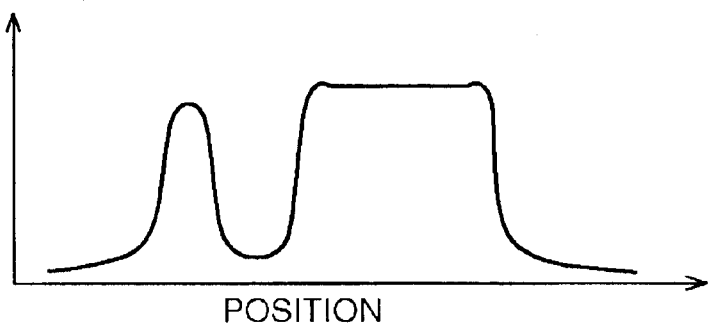
FIG. 7 is a graph showing the distribution of light intensity I+F2 along the II—II line in FIG. 5.

Then, the distribution of the light intensity I and the distribution of the light intensity F2 are added to each other, thereby obtaining a distribution of light intensity taking the influence of the local flare into consideration. The distribution of the light intensity I+F2 along the II—II line in FIG. 5 is shown in FIG. 7.

Note that the expression expressing the light intensity F2 due to the influence of the local flare is not limited to the expression 1. For example, it may be expressed as the sum of a plurality of functions, as shown in the following expression 2.

$$F2=\alpha+\Sigma\{\beta 1 \times f1(Rn, Sn, Tn)+\beta 2 \times f2(Rn, Sn, Tn)\}(n=1,\text{Expression 2}$$

Moreover, the coefficients f1 and f2 are not limited to the error functions, and may be other functions.

Third Embodiment

Figure 8:
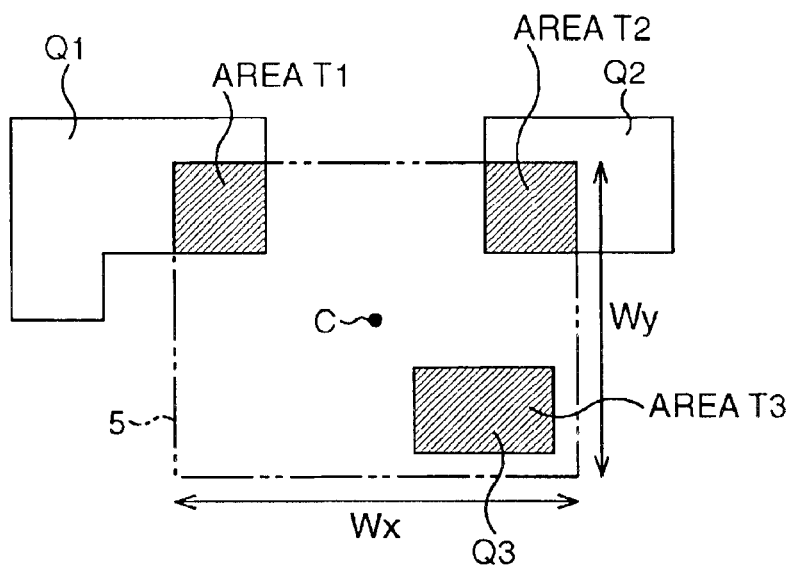
FIG. 8 is a schematic view showing a principle of a light intensity simulation method according to a third embodiment of the present invention.

Next, a light intensity simulation method according to a third embodiment of the present invention will be explained. According to the third embodiment as well, the influence of the local flare is estimated based on a shape of a photomask, not on the aberration of the lens. However, an estimation method is different from that of the second embodiment. FIG. 8 is a schematic view showing a principle of the light intensity simulation method according to the third embodiment of the present invention.

In a photomask shown in FIG. 8, it is supposed that only opening patterns Q1 to Q3 are formed. According to this embodiment, a pattern occupying factor $\rho_C$, as expressed by the following expression 3, is defined with respect to a light intensity calculation point C on the photomask.

$$\rho_C=(\Sigma Tn)/(Wx \times Wy) \qquad \text{Expression 3}$$

Here, Tn is an area of a part of an opening pattern Qn existing inside a rectangular region 5 whose length in an x direction on the photomask is Wx and whose length in a y direction on the photomask is Wy, with the light intensity calculation point C being its center (the part with the hatching in FIG. 8). Note that the x direction and the y direction are arbitrary as long as they are crossing perpendicularly to each other. Based on this pattern occupying factor, the light intensity at the light intensity calculation point C on the photomask is found approximately. At this time, light intensity F3 due to the influence of the local flare is expressed by the following expression 4.

$$F3=f(\rho_C) \qquad \text{Expression 4}$$

The function $f(\rho_C)$ is not limited to one type of function, and it may be, for example, a primary expression. In this case, the light intensity F3 is expressed by the following expression 5.

$$F3=\alpha \times \rho_C+\beta \qquad \text{Expression 5}$$

The coefficients $\alpha$ and $\beta$ in the expression 5 are fitting coefficients.

Then, the light intensity F3 due to the influence of the local flare is found at each light intensity calculation point on the photomask. Thereafter, similarly to the second embodiment, the result is added to a distribution of light intensity I which is obtained by the conventional simulation without consideration given to the influence by the local flare. It should be noted that either of the distribution of the light intensity F3 due to the influence of the local flare and the distribution of the light intensity I obtained by the simulation without consideration given to the influence by the local flare may be found first.

According to the above-described third embodiment as well, it is possible to easily carry out the simulation of the light intensity with high accuracy.

Next, the result of the actual light intensity simulation by the method according to the third embodiment will be explained. Here, the light intensity simulation is carried out in exposure using the photomask shown in FIG. 5.

According to this light intensity simulation, similarly to the second embodiment, the simulation of the light intensity I is first carried out without consideration given to the local flare according to the conventional method, thereby obtaining a graph shown in FIG. 6A.

Figure 9:
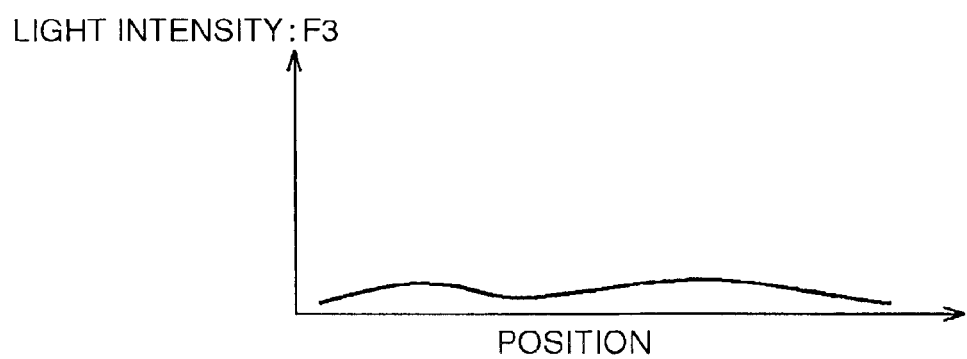
FIG. 9 is a graph showing the distribution of light intensity F3 along the II—II line in FIG. 5.

Next, the distribution of the light intensity F3 is found from the expression 5, based on the pattern occupying factor. The distribution of the light intensity F3 along the II—II line in FIG. 5 is shown in FIG. 9.

Figure 10:
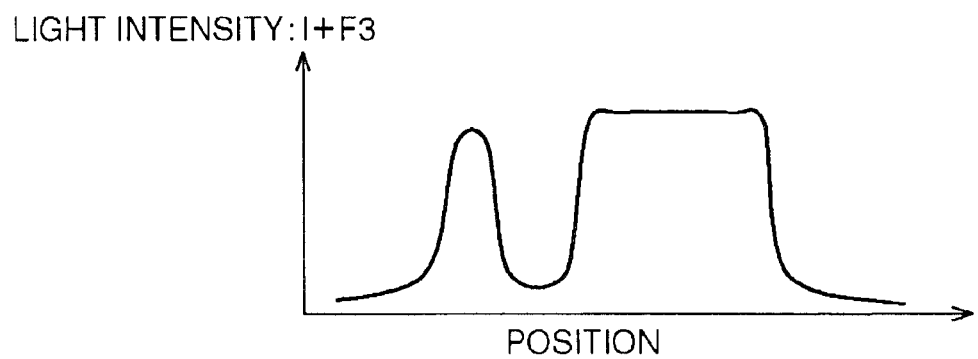
FIG. 10 is a graph showing the distribution of light intensity I+F3 along the II—II line in FIG. 5.

Then, the distribution of the light intensity I and the distribution of the light intensity F3 are added to each other, thereby obtaining a distribution of light intensity taking the influence of the local flare into consideration. The distribution of the light intensity I+F3 along the II—II line in FIG. 5 is shown in FIG. 10.

Note that the expression expressing the light intensity F3 due to the influence of the local flare is not limited to the primary function shown in expression 5. For example, it may be a quadratic function as shown in the following expression 6.

$$F3=\alpha \times \rho_C^2+\beta \times \rho_C+\gamma \qquad \text{Expression 6}$$

The coefficients $\alpha$, $\beta$ and $\gamma$ in the expression 6 are fitting coefficients.

Fourth Embodiment

Figure 11:
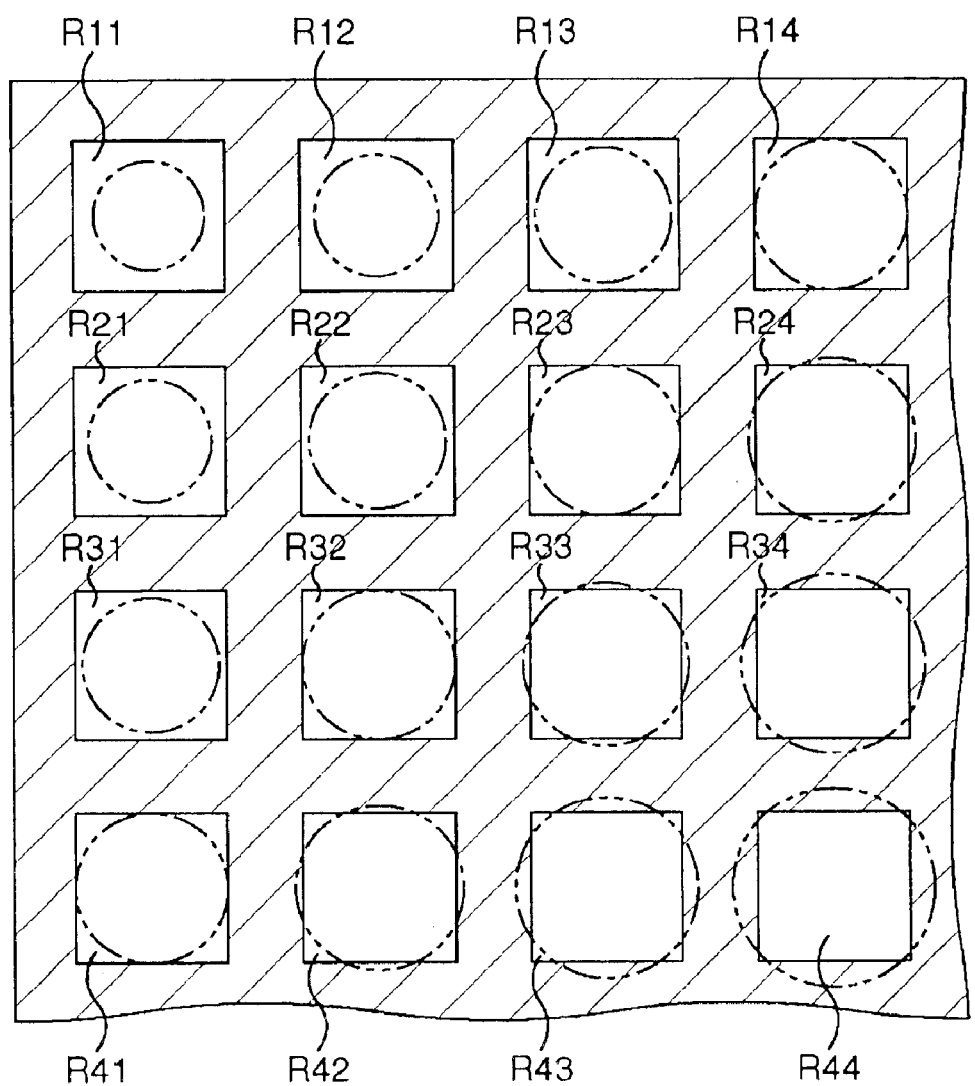
FIG. 11 is a schematic view showing a designing method of a photomask according to a fourth embodiment of the present invention.
Figure 12:
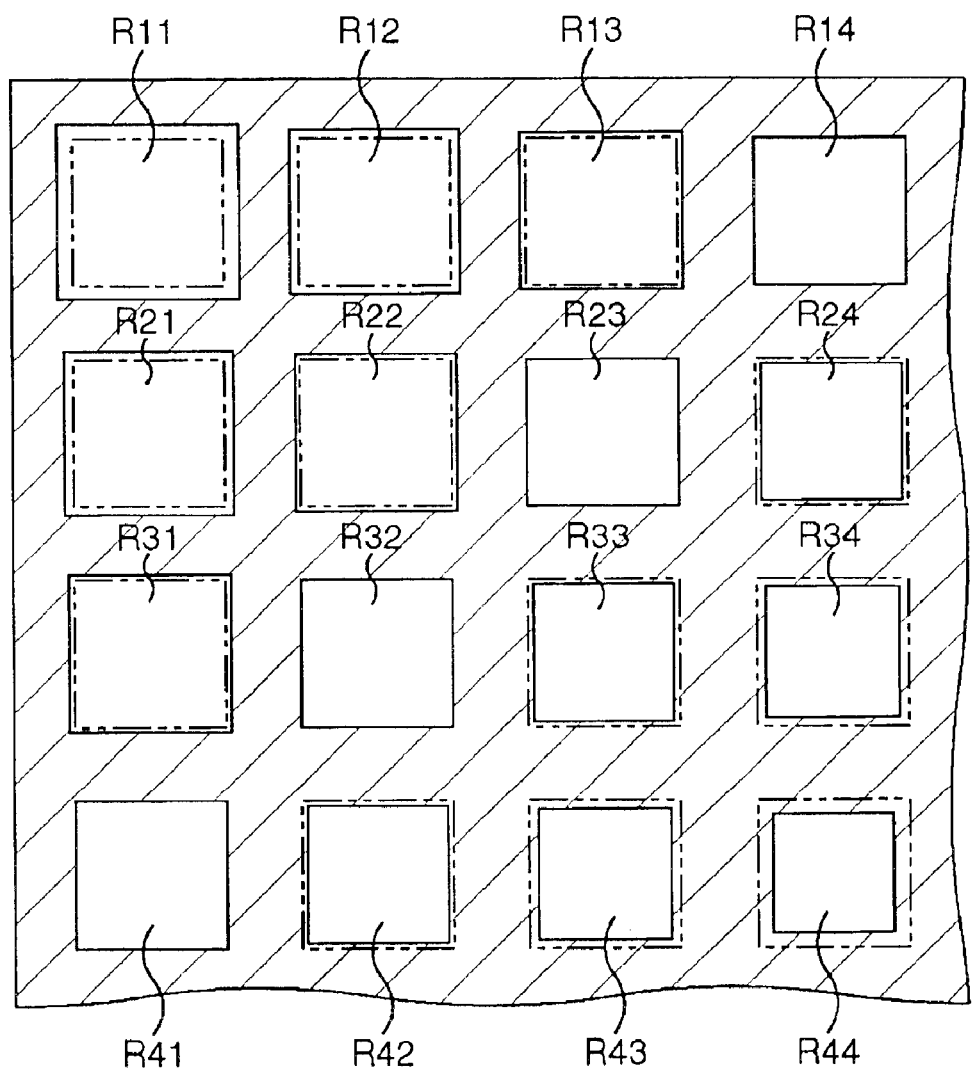
FIG. 12 is similarly a schematic view showing the designing method of the photomask according to the fourth embodiment of the present invention.

Next, a designing method of a photomask according to a fourth embodiment of the present invention will be explained. According to the fourth embodiment, patterns of the photomask are designed based on the result of the light intensity simulation which is obtained by the method according to the first embodiment. FIG. 11 and FIG. 12 are schematic views showing the designing method of the photomask according to the fourth embodiment of the present invention. In FIG. 11 and FIG. 12, a region with the hatching is a light-shielding region, and regions without the hatching, which are surrounded by the region with the hatching, are opening regions.

First, as shown in FIG. 11, the patterns of the photomask are determined temporarily based on design data or the like of a circuit.

Next, based on the distribution of the light intensity which is obtained by the light intensity simulation method according to the first embodiment, contour lines of the light intensity are collated with the patterns of the photomask which are determined temporarily. In FIG. 11, curved lines (circles) shown by two-dot chain lines are critical contour lines for forming hole patterns, among the contour lines of the light intensity which transmits the respective opening regions. In other words, a photosensitive material such as a photosensitive resist is exposed inside the curved lines (circles).

Next, when the region surrounded by the curved line showing the critical contour line is narrower than a design value, that is, when an opening area of the photomask is narrow, the opening region is corrected so that the opening region becomes wider. Conversely, when the region is wider than the design value, that is, when the opening area of the photomask is wide, the opening region is corrected so that the opening region becomes narrower. In FIG. 11, it is supposed that a rectangular region which is at the a-th row from the top and at the b-th column from the left is Rab. For example, regions R11, R12, R13, R21, R22 and R31 are subjected to the correction so that these areas become wider, and regions R24, R33, R34, R42, R43 and R44 are subjected to the correction so that these areas become narrower. FIG. 12 shows the patterns of the photomask after the correction. Two-dot chain lines in FIG. 12 show patterns before the correction.

By making such correction, the contour line of desired light intensity can be obtained at each opening region, and the pattern such as the hole pattern of a predetermined size is formed in the photosensitive material. Namely, the design data of the photomask which is determined temporarily is corrected based on the light intensity simulation result, to thereby form the desired patterns in the photosensitive material.

Incidentally, this designing method can be carried out based on the result of the light intensity simulation which is obtained by the method according to the second or the third embodiment.

Figure 13:
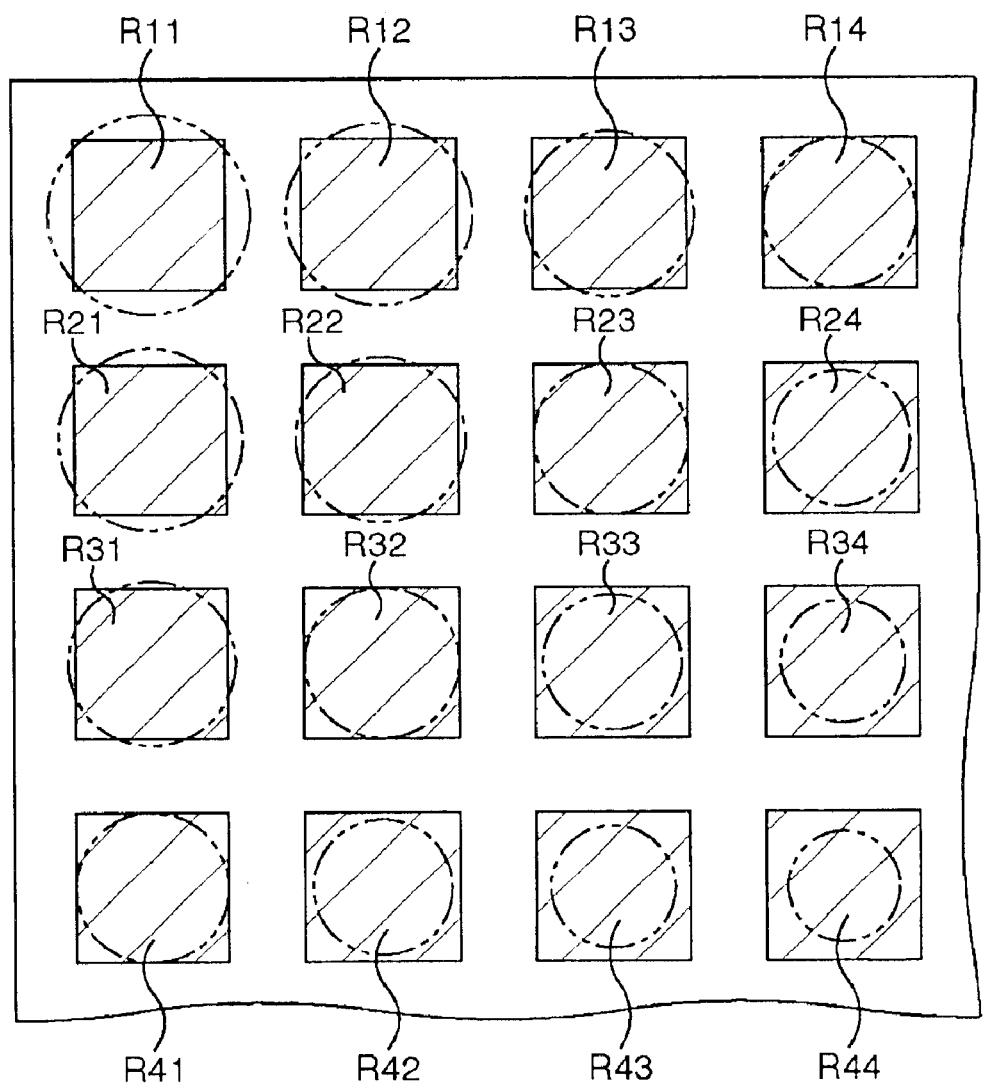
FIG. 13 is a schematic view showing an example in which the fourth embodiment of the present invention is applied to a light-shielding pattern.
Figure 14:
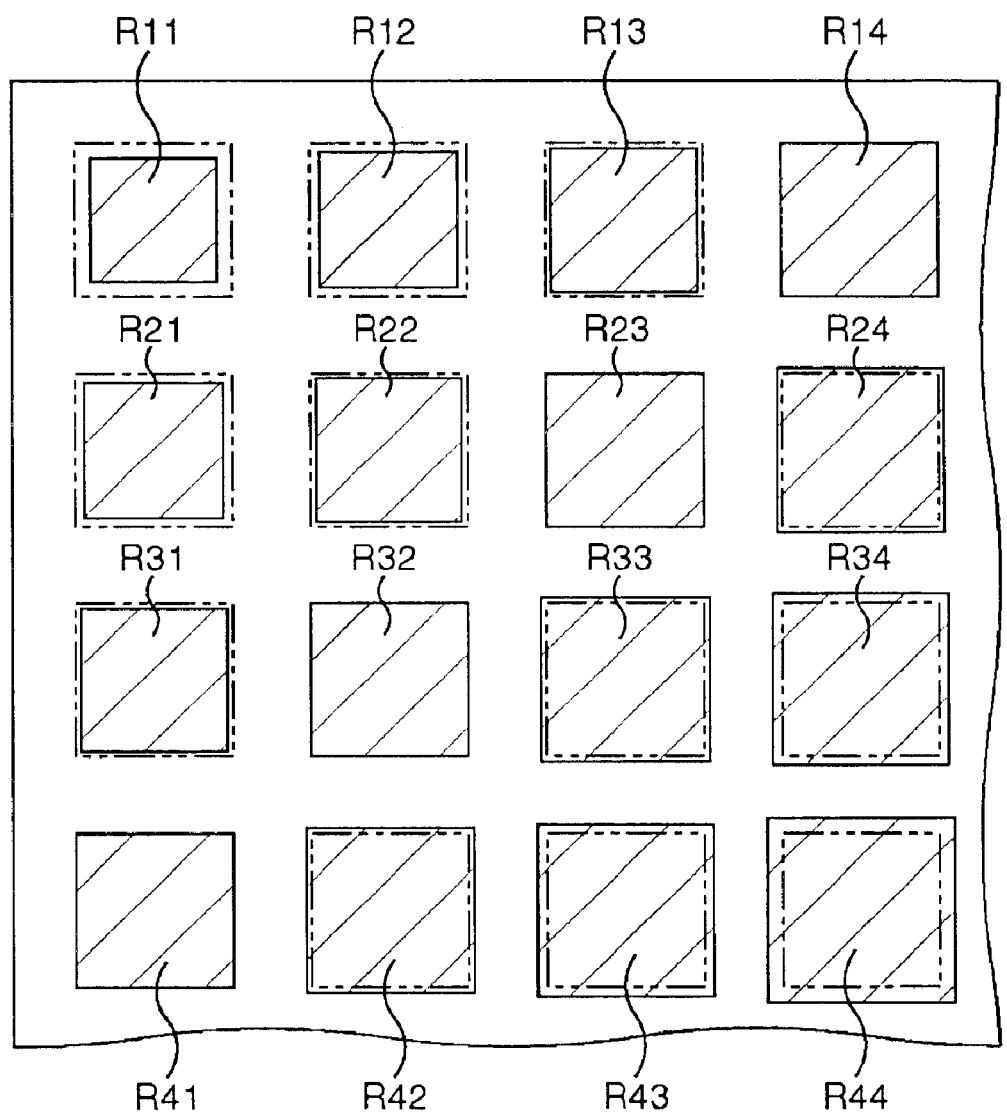
FIG. 14 is similarly a schematic view showing an example in which the fourth embodiment of the present invention is applied to the light-shielding pattern.

Moreover, the fourth embodiment can be applied to the light-shielding region as well. FIG. 13 and FIG. 14 are schematic views showing an example in which the fourth embodiment is applied to the light-shielding region. In FIG. 13 and FIG. 14, regions with the hatching are light-shielding regions, and a region without the hatching, which surround the regions with the hatching, is an opening region.

When, for example, a relationship between the shielding regions and the critical contour lines of the light intensity is obtained as shown in FIG. 13, the following correction is suitable. When the region surrounded by the curved line showing the critical contour line is narrower than the design value, that is, when the light-shielded area of the photomask is narrow, the light-shielding region is corrected so that the light-shielding region becomes wider. Conversely, when the region is wider than the design value, that is, when the light-shielded area of the photomask is wide, the light-shielding region is corrected so that the light-shielding region becomes narrower. In the example shown in FIG. 13, regions R24, R33, R34, R42, R43 and R44 are subjected to the correction so that these areas become wider, and regions R11, R12, R13, R21, R22, and R31 are subjected to the correction so that these areas become narrower. FIG. 14 shows the patterns of the photomask after the correction. Two-dot chain lines in FIG. 14 show patterns before the correction.

Fifth Embodiment

Figure 15:
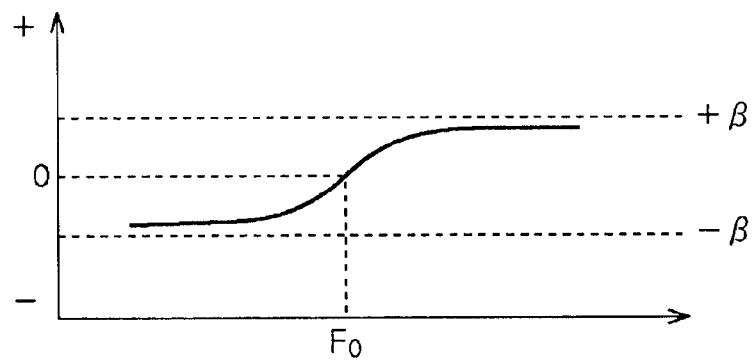
FIG. 15 is a graph used for a designing method of a photomask according to a fifth embodiment of the present invention.

Next, a designing method of a photomask according to a fifth embodiment of the present invention will be explained. According to the fifth embodiment, patterns of the photomask is designed based on the distribution of the light intensity F2 due to the influence of the local flare, which is found by the light intensity simulation method according to the second embodiment. FIG. 15 is a graph used for the designing method of the photomask according to the fifth embodiment of the present invention.

According to this embodiment, a relationship between the light intensity F2 due to the influence of the local flare and a side moving amount E, as shown in FIG. 15, is found in advance. In FIG. 15, $F_0$ indicates reference light intensity at which a correction amount (the side moving amount E) becomes 0. It should be noted that the side moving amount E is an amount of a side of an opening region or a light-shielding region moving toward the adjacent light-shielding region or the opening region. The graph shown in FIG. 15 is expressed by, for example, the following expression 7.

$$E = \beta \times \{2/(1+\exp(\alpha(F2-F_0)))-1\} \quad \text{Expression 7}$$

The coefficients $\alpha$ and $\beta$ in the expression 7 are fitting coefficients.

Then, the patterns of the photomask are determined based on design data or the like of a circuit, as shown in FIG. 11. Next, the light intensity F2 due to the influence of the local flare at each point on the photomask is found from the distribution of the light intensity F2.

Thereafter, the side moving amount E is found for the light intensity F2 at each point from the graph shown in FIG. 15, and the each of the patterns is corrected. At this time, when the object of finding the side moving amount E is the opening region, the value of the coefficient $\alpha$ in the expression 7 is made to be positive, and the value of the coefficient $\beta$ is made to be positive. Namely, the value of the side moving amount E is made to be higher as the light intensity F2 is lower. Meanwhile, when the object of finding the side moving amount E is the light-shielding region, the value of the coefficient $\alpha$ in the expression 7 is made to be positive, and the value of the coefficient $\beta$ is made to be negative. Namely, the value of the side moving amount E is made to be higher as the light intensity F2 is higher. In FIG. 15, the graph shows the case where the value of the coefficient $\alpha$ in the expression 7 is positive, and the value of the coefficient $\beta$ is negative.

By making such correction, it is possible to obtain the same mask patterns as those shown in FIG. 12, in either case where the object of finding the side moving amount E is the opening region or the light-shielding region.

Similarly, when the patterns as shown in FIG. 13 are determined temporarily, it is possible to obtain the mask patterns which are the same as those shown in FIG. 14.

Sixth Embodiment

Figure 16:
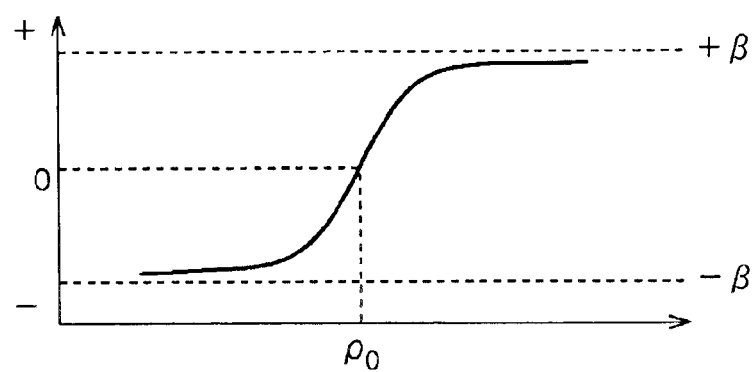
FIG. 16 is a graph used for a designing method of a photomask according to a sixth embodiment of the present invention.

Next, a designing method of a photomask according to a sixth embodiment of the present invention will be explained. According to the sixth embodiment, patterns of the photomask are designed based on the distribution of the pattern occupying factor which is found by the light intensity simulation method according to the third embodiment. FIG. 16 is a graph used for the designing method of the photomask according to the sixth embodiment of the present invention.

According to this embodiment, a relationship between the pattern occupying factor ρ and a side moving amount E, as shown in FIG. 16, is found in advance. In FIG. 16, $\rho_0$ indicates a reference pattern occupying factor at which a correction amount (the side moving amount E) becomes 0. It should be noted that the side moving amount E indicates an amount of a side of a region (an opening region or a light-shielding region), which is the object of finding the pattern occupying factor, moving toward the adjacent region side (the light-shielding region or the opening region). Namely, when the side moving amount E is positive, the region being the object of finding the pattern occupying factor increases. The graph shown in FIG. 16 is expressed by, for example, the following expression 8.

$$E = \beta \times \{2/(1+\exp(\alpha(\rho-\rho_0)))-1\} \quad \text{Expression 8}$$

The coefficients α and β in the expression 8 are fitting coefficients.

Then, the patterns of the photomask are determined temporarily based on design data or the like of a circuit, as shown in FIG. 11. Next, the pattern occupying factor ρ at each point on the photomask is found from the distribution of the pattern occupying factor ρ.

Thereafter, the side moving amount E is found for the pattern occupying factor ρ at each point from the graph shown in FIG. 16, and each of the patterns which is determined temporarily is corrected. At this time, when the object of finding the pattern occupying factor is the opening region in the patterns shown in FIG. 11, the value of the coefficient α in the expression 8 is made to be positive, and the value of the coefficient β is made to be positive. Namely, the value of the side moving amount E is made to be higher as the pattern occupying factor ρ is lower. Meanwhile, when the object of finding the pattern occupying factor is the light-shielding region, the value of the coefficient α in the expression 8 is made to be positive, and the value of the coefficient β is made to be negative. Namely, the value of the side moving amount E is made to be higher as the pattern occupying factor ρ is higher. In FIG. 16, the graph shows the case where the value of the coefficient α in the expression 8 is positive, and the value of the coefficient β is negative.

By making such correction, it is possible to obtain the same mask patterns as those shown in FIG. 12, in either case where the object of finding the pattern occupying factor is the opening region or the light-shielding region.

Similarly, when the patterns as shown in FIG. 13 is determined temporarily, it is possible to obtain the mask patterns which are the same as those shown in FIG. 14.

The embodiments of the present invention can be realized by a computer executing a program. Means for supplying the program to the computer, for example, a computer readable recording medium such as a CD-ROM in which such a program is recorded, or a transmitting medium for transmitting such a program such as the Internet, can be applied as an embodiment of the present invention. Moreover, the above-described program can be applied as an embodiment of the present invention. The above-described program, recording medium, transmitting medium and program product are included in the realm of the present invention.

As described thus far, since the simulation can be carried out while considering the influence of the local flare appropriately, it is possible to secure high accuracy. Further, by correcting the photomask based on the result of the light intensity simulation, it is possible to design the photomask which can faithfully obtain the circuit structure of the designed semiconductor device.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A light intensity simulation method for calculating intensity of light transmitting a photomask by simulation, comprising the step of:

calculating light intensity at respective light intensity calculation points on said photomask, while considering influence of local flare, which is caused by an aberration on the pupil plane of a projection lens, as one of factors, wherein the step of calculating light intensity is performed based on a condition that a rectangular area whose side length is in a 50 μm to 100 μm range is a unit of calculation.

2. A light intensity simulation method for calculating intensity of light transmitting a photomask by simulation, comprising the steps of:

calculating light intensity at respective light intensity calculation points on said photomask, without considering influence of local flare, which is caused by an aberration on the pupil plane of a projection lens, as a factor;

finding positions of barycenters, areas, and transmission factors of respective patterns existing on said photomask;

calculating light intensity only by said influence of local flare at said respective light intensity calculation points on said photomask based on distances between said respective light intensity calculation points and said respective barycenters, and said areas and said transmission factors of said respective patterns; and adding said light intensity without considering said influence of local flare as the factor and said light intensity only by said influence off local flare.

3. The light intensity simulation method according to claim 2, wherein said influence of local flare is expressed by Gaussian distribution, in the step of calculating said light intensity only by said influence of local flare.

4. A light intensity simulation method for calculating intensity of light transmitting a photomask by simulation, comprising the steps of:

calculating light intensity at respective light intensity calculation points on said photomask, without considering influence of local flare, which is caused by an aberration on the pupil plane of a projection lens, as a factor;

defining measuring regions with said respective light intensity calculation points on said photomask as centers thereof;

finding occupying factors of respective patterns existing on said photomask occupying said measuring regions, with respect to said respective light intensity calculation points;

calculating light intensity only by said influence of local flare at said respective light intensity calculation points, based on said pattern occupying factors; and adding said light intensity without considering said influence of local flare as the factor and said light intensity only by said influence of local flare.

5. The light intensity simulation method according to claim 4, wherein said influence of local flare is expressed by a primary expression or a quadratic expression of said pattern occupying factors, in the step of calculating said light intensity only by said influence of local flare.

6. The light intensity simulation method according to claim 4, wherein said measuring regions are rectangular regions, in the step of finding said pattern occupying factors.

7. A light intensity simulation program product for making a computer calculate intensity of light transmitting a photomask by simulation, comprising:

computer readable program code means for processing of calculating light intensity at respective light intensity calculation points on said photomask, while considering influence of local flare, which is caused by an aberration on the pupil plane of a projection lens, as one of factors, wherein the step of calculating light intensity is performed based on a condition that a rectangular area whose side length is in a 50 $\mu$m to 100 $\mu$m range is a unit of calculation.

8. A light intensity simulation program product for making a computer calculate intensity of light transmitting a photomask by simulation, comprising:

computer readable program code means for processing of calculating light intensity at respective light intensity calculation points on said photomask, without considering influence of local flare, which is caused by an aberration on the pupil plane of a projection lens, as a factor;

computer readable program code means for processing of finding positions of barycenters, areas, and transmission factors of respective patterns existing on said photomask;

computer readable program code means for processing of calculating light intensity only by said influence of local flare at said respective light intensity calculation points on the photomask, based on distances between said respective light intensity calculation points and said respective barycenters, and said areas and said transmission factors of said respective patterns; and computer readable program code means for processing of adding said light intensity without considering said influence of local flare as the factor and said light intensity only by said influence of local flare.

9. A light intensity simulation program product for making a computer calculate intensity of light transmitting a photomask by simulation, comprising:

computer readable program code means for processing of calculating light intensity at respective light intensity calculation points on said photomask, without considering influence of local flare, which is caused by an aberration on the pupil plane of a projection lens, as a factor;

computer readable program code means for processing of defining measuring regions with said respective light intensity calculation points on said photomask as centers thereof;

computer readable program code means for processing of finding occupying factors of respective patterns existing on said photomask occupying said measuring regions, with respect to said respective light intensity calculation points;

computer readable program code means for processing of calculating light intensity only by said influence of local flare at said respective light intensity calculation points, based on said pattern occupying factors; and computer readable program code means for processing of adding said light intensity without considering said influence of local flare as the factor and said light intensity only by said influence of local flare.

10. A designing method of a photomask used in manufacturing a semiconductor device, comprising the steps of:

determining temporarily patterns of a photomask based on a circuit structure of said semiconductor device;

calculating light intensity at respective light intensity calculation points on said photomask, while considering influence of local flare, which is caused by an aberration on the pupil plane of a projection lens, as one of factors; and correcting said temporarily determined patterns based on the result of said calculating, wherein the step of calculating light intensity is performed based on a condition that a rectangular area whose side length is in a 50 $\mu$m to 100 $\mu$m range is a unit of calculation.

11. A designing method of a photomask used in manufacturing a semiconductor device, comprising the steps of:

determining temporarily patterns of a photomask based on a circuit structure of said semiconductor device;

calculating light intensity at respective light intensity calculation points on said photomask, without considering influence of local flare, which is caused by an aberration on the pupil plane of a projection lens, as a factor;

finding positions of barycenters, areas, and transmission factors of respective patterns existing on said photomask;

calculating light intensity only by influence of local flare at said respective light intensity calculation points art said photomask, based on distances between said respective light intensity calculation points and said respective barycenters, and said areas and said transmission factors of said respective patterns;

adding said light intensity without considering said influence of local flare as the factor and said light intensity only by said influence of local flare; and correcting said temporarily determined patterns based on the result of said adding.

12. The designing method of the photomask according to claim 11, wherein said influence of local flare is expressed by Gaussian distribution, in the step of calculating said light intensity only by said influence of local flare.

13. A designing method of a photomask used in manufacturing a semiconductor device, comprising the steps of:

determining temporarily patterns of a photomask based on a circuit structure of said semiconductor device;

finding positions of barycenters, areas, and transmission factors of respective patterns existing on said photomask;

calculating light intensity only by said influence of local flare at said respective light intensity calculation points on said photomask, based on distances between said respective light intensity calculation points and said respective barycenters, and said areas and said transmission factors of said respective patterns;

correcting said temporarily determined patterns based on a relationship between a light intensity only by influence of local flare and a correction amount of a pattern, which is found in advance.

14. The designing method of the photomask according to claim 13, wherein said influence of local flare is expressed by Gaussian distribution, in the step of calculating said light intensity only by said influence of local flare.

15. A designing method of a photomask used in manufacturing a semiconductor device, comprising the steps of:

determining temporarily patterns of a photomask based on a circuit structure of said semiconductor device;

calculating light intensity at respective light intensity calculation points on said photomask, without considering influence of local flare, which is caused by an aberration on the pupil plane of a projection lens, as a factor;

defining measuring regions with said respective light intensity calculation points on said photomask as centers thereof;

finding occupying factors of respective patterns existing on said photomask occupying said measuring regions, with respect to said respective light intensity calculation points;

calculating light intensity only by said influence of local flare at said respective light intensity calculation points, based on said pattern occupying factors;

adding said light intensity without considering said influence of local flare as the factor and said light intensity only by said influence of local flare; and correcting said temporarily determined patterns based on the result of said adding.

16. The designing method of the photomask according to claim 15, wherein said influence of local flare is expressed by a primary expression or a quadratic expression of said pattern occupying factors, in the step of calculating said light intensity only by said influence of local flare.

17. The designing method of the photomask according to claim 15, wherein said measuring regions are rectangular regions, in the step of finding said pattern occupying factors.

18. A designing method of a photomask used in manufacturing a semiconductor device, comprising the steps of:

determining temporarily patterns of a photomask based on a circuit structure of said semiconductor device;

defining measuring regions with said respective light intensity calculation points on said photomask as centers thereof;

finding occupying factors of respective pattern existing on said photomask occupying said measuring regions, with respect to said respective light intensity calculation points; and correcting said temporarily determined patterns based on a relationship between a pattern occupying factor and a correction amount of the pattern, which is found in advance.

19. The designing method of the photomask according to claim 18, wherein said influence of local flare is expressed by a primary expression or a quadratic expression of said pattern occupying factors, in the step of calculating said light intensity only by said influence of local flare.

20. The designing method of the photomask according to claim 18, wherein said measuring regions are rectangular regions, in the step of finding said pattern occupying factors.

* * * * *

UNITED STATES PATENT AND TRADEMARK OFFICE
CERTIFICATE OF CORRECTION

PATENT NO.     : 6,862,726 B2
DATED          : March 1, 2005
INVENTOR(S)    : Hiroki Futatsuya et al.

It is certified that error appears in the above-identified patent and that said Letters Patent is hereby corrected as shown below:

<u>Title page,</u>
Item [73], Assignee, should read -- Fujitsu Limited --.

Signed and Sealed this

Fourteenth Day of March, 2006

JON W. DUDAS
*Director of the United States Patent and Trademark Office*